(12) United States Patent
Miyake et al.

(10) Patent No.: US 8,875,362 B2
(45) Date of Patent: Nov. 4, 2014

(54) METHOD OF MANUFACTURING PIEZOELECTRIC DEVICE

(75) Inventors: Takashi Miyake, Nagaokakyo (JP); Yuji Toyota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 956 days.

(21) Appl. No.: 12/968,303

(22) Filed: Dec. 15, 2010

(65) Prior Publication Data

US 2011/0146041 A1      Jun. 23, 2011

(30) Foreign Application Priority Data

Dec. 21, 2009   (JP) .................. 2009-289687

(51) Int. Cl.
*H03H 3/02* (2006.01)
*H03H 9/15* (2006.01)
*H03H 9/02* (2006.01)
*H03H 9/10* (2006.01)

(52) U.S. Cl.
CPC ............. *H03H 3/02* (2013.01); *H03H 9/02574* (2013.01); *H03H 9/1014* (2013.01); *H03H 9/1071* (2013.01)
USPC .............. 29/25.35; 29/830; 29/852; 156/252; 156/253; 310/320; 310/344

(58) Field of Classification Search
CPC ... H03H 3/02; H03H 9/1014; H03H 9/02574; H03H 9/1071; H05K 1/115; H05K 1/0393; H05K 3/0058
USPC ................ 29/25.35, 830, 852; 156/252, 253; 310/320, 324, 340, 344
See application file for complete search history.

(56) References Cited

U.S. PATENT DOCUMENTS

| 6,729,001 B2 * | 5/2004 | Bureau et al. ................. 29/25.35 |
| 2005/0286240 A1 * | 12/2005 | Sakamoto et al. ............. 361/803 |
| 2007/0193679 A1 * | 8/2007 | Iwata ......................... 156/253 X |
| 2009/0224851 A1 | 9/2009 | Feiertag et al. |

FOREIGN PATENT DOCUMENTS

| JP | 06314947 A | * 11/1994 | ................. 29/25.35 |
| JP | 2002-9583 A | 1/2002 | |
| JP | 2004-193292 A | 7/2004 | |
| JP | 2008-546207 A | 12/2008 | |

* cited by examiner

*Primary Examiner* — A. Dexter Tugbang
(74) *Attorney, Agent, or Firm* — Keating & Bennett, LLP

(57) ABSTRACT

A method of manufacturing a piezoelectric device includes the steps of bonding a first substrate to a second substrate having a toughness greater than that of the first substrate, forming a first though-hole through the first substrate from the side opposite to the side on which the second substrate is bonded, and forming a second through-hole through the second substrate at a location corresponding to the first through-hole by a formation method different from that used to form the first through-hole from the side opposite to the side on which the first substrate is bonded.

6 Claims, 5 Drawing Sheets

METHOD OF MANUFACTURING PIEZOELECTRIC DEVICE

BACKGROUND OF THE INVENTION

1. Field of the Invention

The present invention relates to a method of manufacturing a piezoelectric device, and more particularly, to a method of manufacturing a piezoelectric device including a piezoelectric substrate that is bonded to another substrate.

2. Description of the Related Art

A circuit section of a wireless communication device, such as a cellular phone, for example, requires an interstage filter and a duplexer. Piezoelectric devices have been used in interstage filters and duplexers in the past. Examples of the piezoelectric devices include elastic wave devices, such as a surface acoustic wave (SAW) device and a boundary acoustic wave device, bulk acoustic wave (BAW) devices, film bulk acoustic resonators (FBAR), and other suitable devices. These piezoelectric devices include a piezoelectric substrate.

An example of a known piezoelectric device is described, for example, in Japanese Unexamined Patent Application Publication No. 2008-546207. As shown in FIG. 5, in Japanese Unexamined Patent Application Publication No. 2008-546207, comb-shaped electrodes 113 and 123 are provided on a first piezoelectric substrate 111 and a second piezoelectric substrate 121, respectively. The first piezoelectric substrate 111 and the second piezoelectric substrate 121 are connected to one another by a joining member 131 such that the comb-shaped electrodes 113 and 123 face each other. The comb-shaped electrodes 113 and 123 are electrically connected to connection electrodes 112 and 122, respectively. The connection electrodes 112 and 122 are electrically connected to each other. A through-hole 124 is arranged to extend through the second piezoelectric substrate 121 to electrically connect the connection electrode 122 to a surface electrode 133.

Heretofore, piezoelectric devices including a piezoelectric substrate that is bonded to another substrate in order to adjust the temperature characteristic of the resonant frequency have been known. When a bonded structure is applied to the structure of Japanese Unexamined Patent Application Publication No. 2008-546207, a through-hole must be provided through the structure having the bonded structure. Depending upon the method used to form the through-hole, problems such as the time required to create the through hole or the generation of microcracks have been observed.

SUMMARY OF THE INVENTION

To overcome the problems described above, preferred embodiments of the present invention provide a manufacturing method in which the processing time is reduced without generating microcracks when a through-hole is formed through a substrate having a bonded structure.

According to a preferred embodiment of the present invention, a method of manufacturing a piezoelectric device includes the steps of bonding a first substrate to a second substrate having a toughness greater than that of the first substrate, forming a first though-hole through the first substrate from a side opposite to the side on which the second substrate is bonded, and forming, at a location corresponding to the first through-hole, a second through-hole through the second substrate from the side opposite to the side on which the first substrate is bonded by a different method from that used to form the first through-hole.

The first and second through-holes that respectively pass through the first substrate and the second substrate are preferably formed using different methods. Therefore, the processing time can be reduced and the generation of microcracks can be prevented when the through-holes are formed.

In the method of manufacturing a piezoelectric device according to a preferred embodiment of the present invention, the first substrate is preferably a piezoelectric substrate, for example.

In addition, the method of manufacturing a piezoelectric device according to a preferred embodiment of the present invention preferably includes the steps of forming a first connection electrode in the first through-hole, and forming a second connection electrode in the second through-hole.

In the method of manufacturing a piezoelectric device according to a preferred embodiment of the present invention, a formation method for the second through-hole in the step of forming the second through-hole is preferably a sandblast method, for example.

In this case, the adhesion strength of the second connection electrode is effectively improved.

In the method of manufacturing a piezoelectric device according to a preferred embodiment of the present invention, a formation method for the first through-hole in the step of forming the first through-hole is preferably a reactive ion etching method, for example.

In this case, the first through-hole can be formed without generating microcracks on the first substrate.

In the method of manufacturing a piezoelectric device according to a preferred embodiment of the present invention, the coefficient of linear expansion of the second substrate is preferably less than that of the first substrate.

In this case, the thermal expansion in the first substrate is minimized and prevented by the second substrate. Therefore, a change in frequency caused by the thermal expansion in the first substrate is effectively reduced.

The method of manufacturing a piezoelectric device according to a preferred embodiment of the present invention preferably includes the step of bonding a third substrate to the surface of the first substrate opposite to the surface of the first substrate on which the second substrate is bonded, with a hollow space therebetween.

In this case, the size of the piezoelectric device can be effectively reduced.

In addition, the method of manufacturing a piezoelectric device according to a preferred embodiment of the present invention preferably includes the step of bonding a fourth substrate to the third substrate.

In this case, the temperature characteristic of the resonant frequency of the third substrate can be effectively adjusted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

FIGS. 1A to 3G are sectional views illustrating a method of manufacturing a piezoelectric device according to a preferred embodiment of the present invention.

Figure 1A:
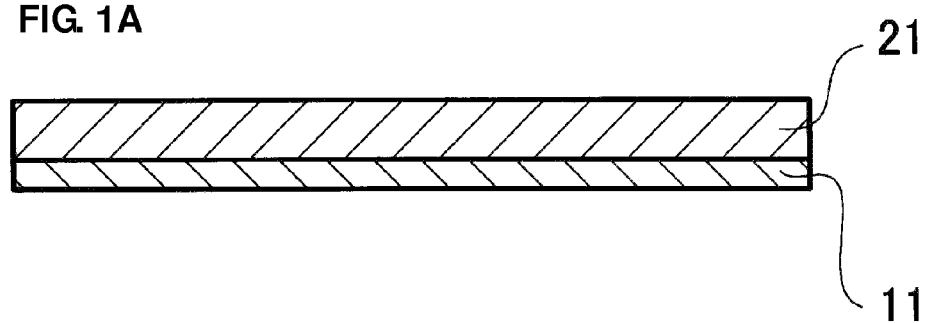
FIGS. 1A, 1B, and 1C are sectional views illustrating a method of manufacturing a piezoelectric device according to a preferred embodiment of the present invention.

First, as shown in FIG. 1A, a first substrate 11 and a second substrate 21 having a toughness greater than that of the first substrate 11 are bonded together. The first substrate 11 may preferably be thinned by, for example, polishing after being bonded to the second substrate 21 to obtain a predetermined thickness. The first substrate 11 is preferably a piezoelectric substrate, for example. Examples of the material for the first substrate 11 preferably include lithium tantalate, lithium niobate, lithium borate, langasite, and crystal. In addition, since a single-crystal substrate has a relatively low toughness, using a single-crystal substrate as the first substrate 11 is especially effective and preferable.

The second substrate 21 is bonded so as to adjust the temperature characteristic of the resonant frequency of the substrate. A preferable material for the second substrate 21 is an insulating material having a small leak current since a through-hole is arranged to extend through the second substrate for conduction in a later process. For example, alumina, glass, sapphire, high-resistance silicon, resin, or other suitable material may preferably be used. In addition, the coefficient of linear expansion of the second substrate 21 is preferably smaller than that of the first substrate 11. This enables the second substrate 21 to minimize and prevent thermal expansion in the first substrate 11 when heat is applied to the substrate. Consequently, changes in the resonant frequency due to the thermal expansion are effectively reduced.

Figure 1B:
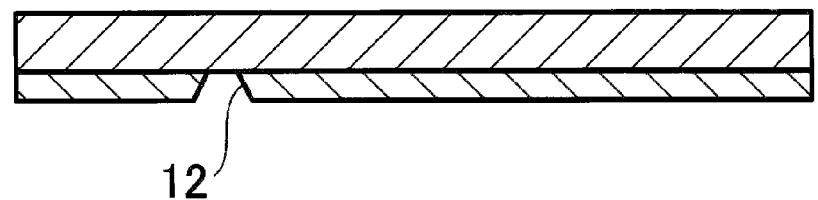

Next, as shown in FIG. 1B, a first through-hole 12 is formed through the first substrate 11. The first through-hole 12 is preferably formed through the first substrate 11 from the side opposite to the side on which the second substrate 21 is bonded. Examples of a method of forming the first through-hole 12 include a reactive ion etching method and an ion milling method. In the case of the reactive ion etching method, etching is performed by a chemical reaction. Therefore, even with the first substrate 11 having a low toughness, etching can be performed without generating microcracks.

Figure 1C:
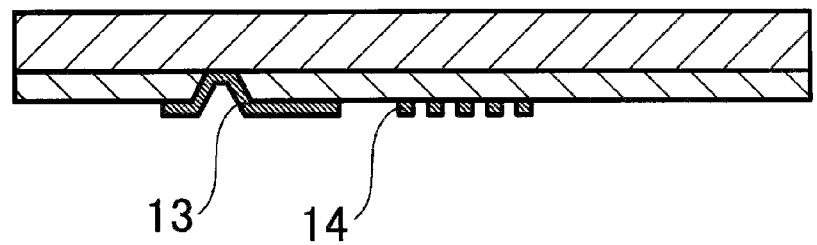

Then, as shown in FIG. 1C, a first connection electrode is preferably formed in the first through-hole 12. At the same time, a first surface electrode 14 may also be preferably formed. An example of the first surface electrode 14 is a comb-shaped electrode. The first connection electrode 13 and the first surface electrode 14 may preferably be formed by, for example, sputtering or vapor deposition. The first connection electrode 13 is formed so as to be electrically connected to the first surface electrode 14. The first connection electrode 13 is preferably formed at a portion along at least the first through-hole 12, and may preferably extend above the main surface. The first surface electrode 14 is formed on the main surface of the first substrate 11.

Figure 2D:
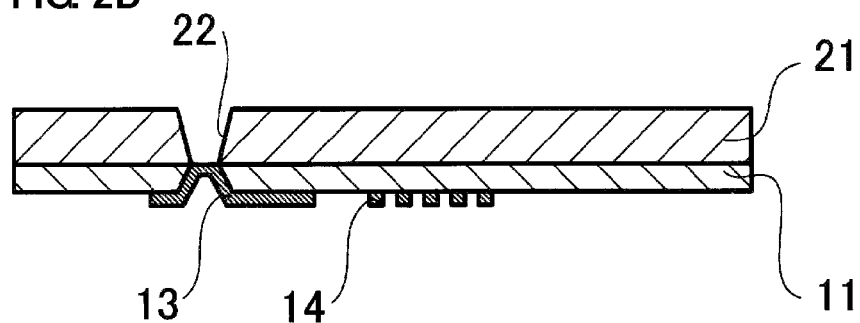
FIGS. 2D, 2E and 2F are sectional views illustrating the method of manufacturing a piezoelectric device according to a preferred embodiment of the present invention.

Then, as shown in FIG. 2D, a second through-hole 22 is preferably formed through the second substrate 21. The second through-hole 22 is preferably formed at a location corresponding to the first through-hole 12 in the first substrate 11 so as to communicate with the first through-hole 12. As a result, a through-hole structure is formed in the substrate. The second through-hole 22 is formed through the second substrate 21 from the side opposite to the side on which the first substrate 11 is bonded. The second through-hole 22 is formed using a formation method that is different from that used for the first through-hole 12. Examples of a method of forming the second through-hole include a sandblast method and a laser processing method. These formation methods can preferably reduce processing time as compared to the formation method for the first through-hole 12. Furthermore, the second through-hole 22 can be formed at a reduced cost. When the second through-hole 22 is formed, the processing may not need to be stopped at the boundary of the substrate and over etching is acceptable to some degree. Since the selectivity ratio of the second substrate 21 differs from that of the first connection electrode 13, the processing is allowed to be performed to an extent to which the first connection electrode 13 remains.

Figure 2E:
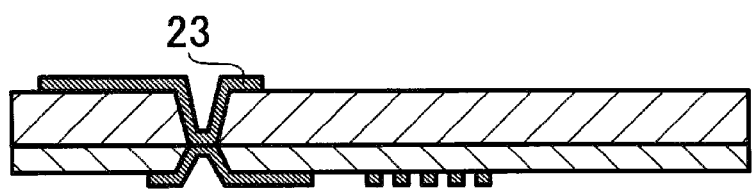

Then, as shown in FIG. 2E, a second connection electrode 23 is preferably formed in the second through-hole 22. The second connection electrode 23 is formed so as to electrically connect to the first connection electrode 13. The second connection electrode 23 can preferably be formed by, for example, sputtering or vapor deposition. In this preferred embodiment, the electrodes are formed separately from the first substrate 11 side and the second substrate 21 side, with respect to the through-hole structure. By forming the electrodes separately, the conductivity of the through-hole structure is ensured as compared to the case in which the electrodes are formed together at the same time. When the electrodes are formed together at the same time, the electrodes must be filled into the through-hole structure. Therefore, it is highly probable that inadequate filling will cause an insufficient conductivity. In addition, the step of filling the electrodes is very difficult since filling/plating is performed after a feeding film is formed on the side wall of the through-holes 12.

The second connection electrode 23 is preferably formed at a portion along at least the second through-hole 22. When the second through-hole 22 is formed using a sandblast method, the surface of the second through-hole 22 is relatively rough. This improves the strength with which the second connection electrode 23 adheres to the second substrate 21 when the second connection electrode 23 is formed.

Figure 2F:
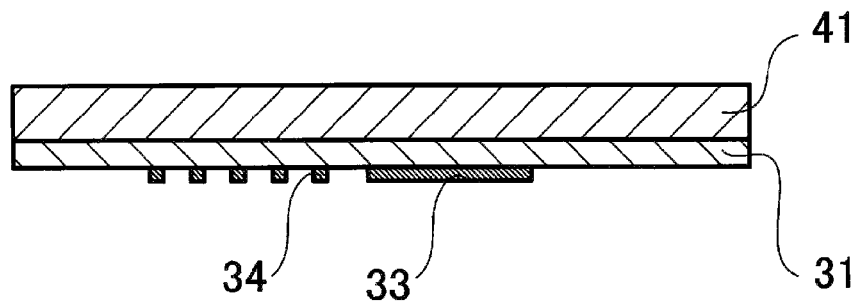

In addition, as shown in FIG. 2F, a third substrate 31 and a fourth substrate 41 are preferably bonded to one another. Then, a third connection electrode 33 and a third surface electrode 34 are formed on the main surface of the third substrate 31. Alternatively, the bonding may preferably be performed after the third connection electrode 33 and the third surface electrode 34 are formed in advance on the third substrate 31. An example of the third surface electrode 34 is a comb-shaped electrode. The third substrate 31 is preferably a piezoelectric substrate, for example. Examples of the material for the third substrate 31 include those described for the first substrate 11. The fourth substrate 41 is arranged to adjust the temperature characteristic of the resonant frequency of the third substrate 31. Examples of the material for the fourth substrate 41 include those described for the second substrate 21.

Figure 3G:
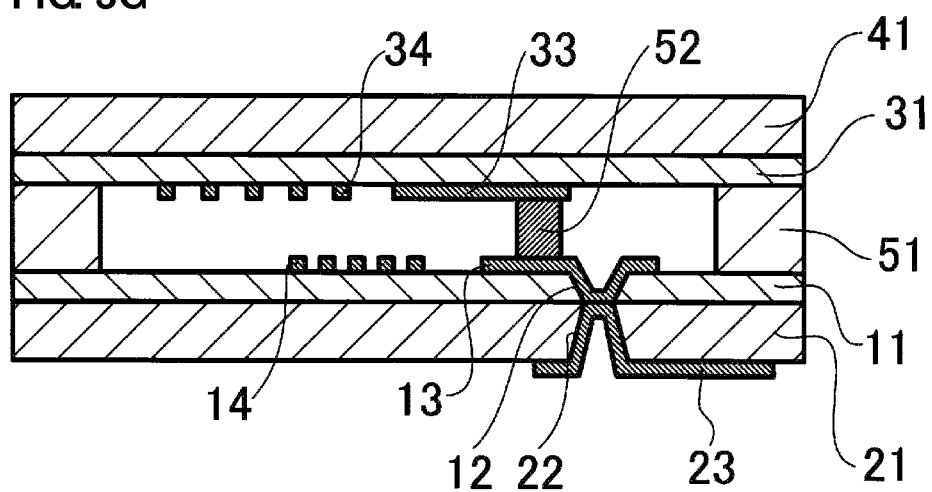
FIG. 3G is a sectional view illustrating the method of manufacturing a piezoelectric device according to a preferred embodiment of the present invention.

Then, as shown in FIG. 3G, the bonded structure of the first substrate 11 and the second substrate 21 and the bonded structure of the third substrate 31 and the fourth substrate 41 are preferably connected to one another using a joining member 51, for example. The surface of the first substrate 11 opposite to the surface bonded to the second substrate 21 is bonded so as to face the third substrate 31 with a hollow space therebetween.

With the bonded structure shown in FIG. 3G, filter functionality, for example, may preferably be provided to the bonded structure of the first substrate 11 and the second substrate 21 and the bonded structure of the third substrate 31 and the fourth substrate 41, thereby defining a duplexer. In addition, since the first surface electrode 14 and the third surface electrode 34 face each other with the hollow space therebetween, the size of the piezoelectric device can be reduced.

In order to electrically connect the first surface electrode 14 and the third surface electrode 34 to the outside, the first surface electrode 14 is preferably electrically connected to the first connection electrode 13. The third surface electrode 34 is preferably electrically connected to the first connection electrode 13 via the third connection electrode 33 and a connection line 52. The second connection electrode 23 preferably extends from the second through-hole 22 so that the piezoelectric device can be mounted on an external motherboard or other suitable structure.

The piezoelectric device has a configuration in which the second substrate 21, as compared to the first substrate 11, on which the second connection electrode 23 is formed faces the outside. With this structure, the second connection electrode 23 is exposed to the outside environment. Therefore, the adhesion strength of the second connection electrode 23 is important in terms of reliability. When the second through-hole 22 is formed by a sandblast method, the adhesion strength is improved, as described above, thereby improving the reliability.

The manufacturing method according to a preferred embodiment of the present invention can be applied to the configuration in which the third substrate 31 and the fourth substrate 41 are bonded together, in addition to the configuration in which the first substrate 11 and the second substrate 21 are bonded together.

Figure 4A:
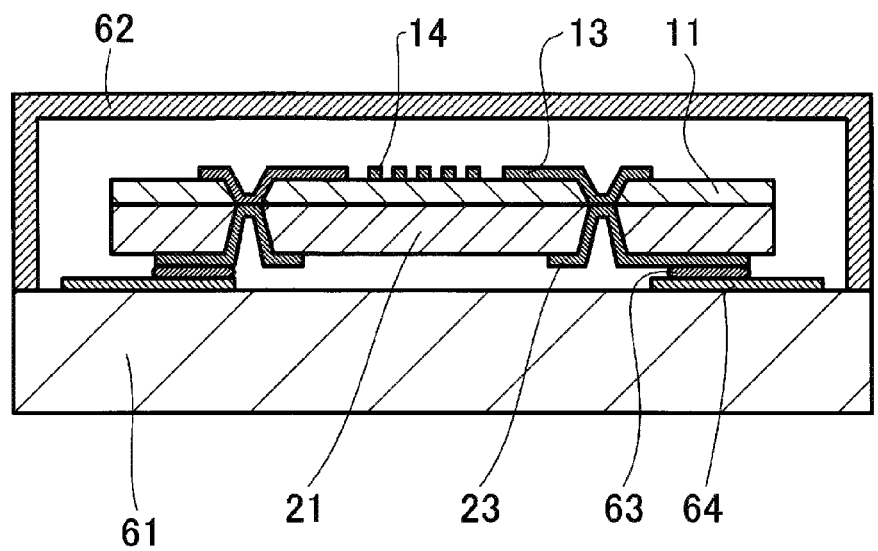
FIGS. 4A and 4B are sectional views of examples of the piezoelectric device formed by the method of manufacturing a piezoelectric device according to a preferred embodiment of the present invention.
Figure 4B:
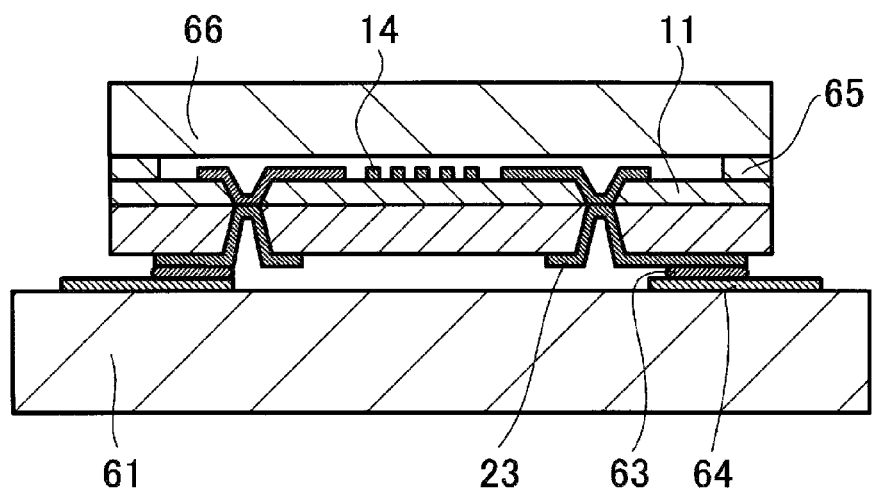
Figure 5:
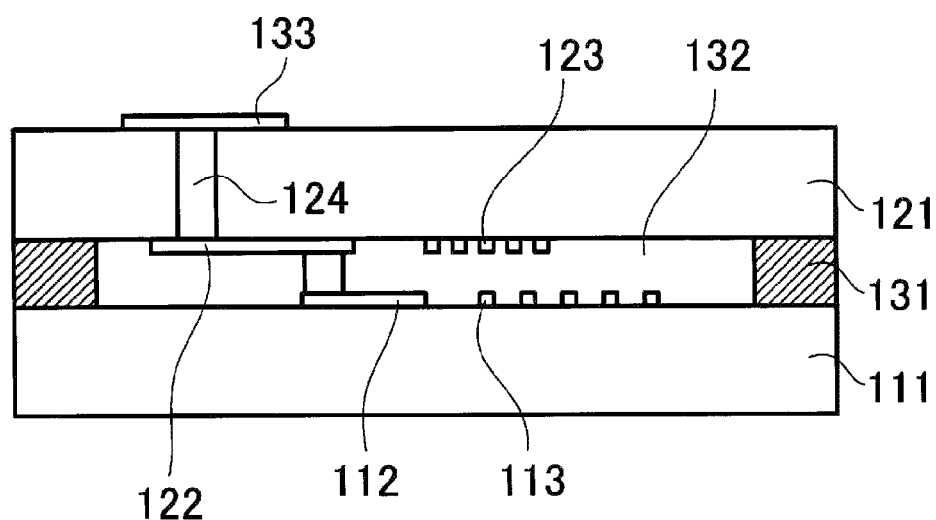
FIG. 5 is a sectional view of a piezoelectric device according to the related art.

FIGS. 4A and 4B are sectional views of other examples of a piezoelectric device manufactured by the method of manufacturing a piezoelectric device according to a preferred embodiment of the present invention. Descriptions of features that are common to those in FIGS. 1A to 3G are omitted.

FIG. 4A illustrates an example of a piezoelectric device according to another preferred embodiment that is sealed by a metallic case. The first substrate 11 is bonded to the second substrate 21. Then, the first surface electrode 14 is formed on the main surface of the first substrate 11. The first surface electrode 14 is electrically connected to the second connection electrode 23 via the first connection electrode 13. The second connection electrode 23 is electrically connected to a mount electrode 64 via a solder bump 63. The mount electrode 64 is formed on a motherboard 61, and the piezoelectric device is mounted on the motherboard 61. A metallic case 62 is preferably arranged over the piezoelectric device so as to protect the first surface electrode 14.

FIG. 4B illustrates an example of a piezoelectric device according to another preferred embodiment in which the first surface electrode 14 of the piezoelectric device is sealed with resin. The first substrate 11 is preferably connected to a resin layer 66 via a joining member 65. An example of the resin layer material is polyimide resin. The first surface electrode 14 is sealed by the resin layer 66 and the joining member 65. The second connection electrode 23 is electrically connected to the mount electrode 64 via the solder bump 63. The mount electrode 64 is formed on the motherboard 61. The piezoelectric device is mounted on the motherboard 61.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method of manufacturing a piezoelectric device, comprising the steps of:
   bonding a first substrate to a surface of a second substrate having a toughness greater than that of the first substrate;
   forming a first though-hole through the first substrate from a side opposite to a side on which the second substrate is bonded; and
   forming a second through-hole through the second substrate from a side opposite to a side on which the first substrate is bonded, at a location corresponding to the first through-hole, by a formation method different from that used to form the first through-hole; wherein
   the first substrate is a piezoelectric substrate; and
   a coefficient of linear expansion of the second substrate is less than that of the first substrate.

2. The method of manufacturing a piezoelectric device according to claim 1, further comprising the steps of:
   forming a first connection electrode in the first through-hole; and
   forming a second connection electrode in the second through-hole.

3. The method of manufacturing a piezoelectric device according to claim 1, wherein, in the step of forming the second through-hole, the formation method for the second through-hole is a sandblast method.

4. The method of manufacturing a piezoelectric device according to claim 1, wherein, in the step of forming the first through-hole, the formation method for the first through-hole is a reactive ion etching method.

5. The method of manufacturing a piezoelectric device according to claim 1, further comprising the step of:
   bonding a third substrate to a surface of the first substrate opposite to a surface on which the second substrate is bonded, with a hollow space therebetween.

6. The method of manufacturing a piezoelectric device according to claim 1, further comprising the step of:
   bonding the third substrate to a fourth substrate.

* * * * *